United States Patent [19]

Nishiyama et al.

[11] 4,182,793
[45] Jan. 8, 1980

[54] PIEZOELECTRIC CRYSTALLINE FILM OF ZINC OXIDE

[75] Inventors: Hiroshi Nishiyama, Mukou; Toshio Ogawa; Tasuku Mashio, both of Nagaokakyo, all of Japan

[73] Assignee: Murata Manufacturing Co., Ltd., Kyoto, Japan

[21] Appl. No.: 913,803

[22] Filed: Jun. 8, 1978

[30] Foreign Application Priority Data

Jun. 9, 1977 [JP] Japan .................................. 52/68454
Jun. 9, 1977 [JP] Japan .................................. 52/68455
Jun. 13, 1977 [JP] Japan .................................. 52/70150
Jun. 13, 1977 [JP] Japan .................................. 52/70151

[51] Int. Cl.$^2$ .................... C23C 15/00; C04B 35/00
[52] U.S. Cl. .............................. 428/432; 204/192 SP;
252/62.9; 427/100; 428/433; 428/469; 428/539
[58] Field of Search ............... 428/433, 432, 469, 539;
427/100; 252/62.9 R; 204/192 SP

[56] References Cited

U.S. PATENT DOCUMENTS

| 3,388,002 | 6/1968 | Foster ........................... 427/100 |
| 3,409,464 | 11/1968 | Shiozawa ........................ 252/62.9 R |
| 3,573,960 | 4/1971 | Duncan ........................... 427/100 |
| 3,655,429 | 4/1972 | Derleck ........................... 427/100 |
| 3,766,041 | 10/1973 | Wasa ............................ 204/192 SP |
| 3,988,232 | 10/1976 | Wasa ............................ 204/192 SP |
| 4,139,678 | 2/1969 | Nishiyama ........................ 428/432 |

Primary Examiner—Ellis P. Robinson
Attorney, Agent, or Firm—Birch, Stewart, Kolasch & Birch

[57] ABSTRACT

Piezoelectric crystallime film on a substrate, which is a crystalline zinc oxide film with a c-axis perpendicular to the substrate surface, the crystalline zinc oxide film containing one copper compound selected from the group consisting of copper sulphide, copper telluride, copper selenide, copper selenate, copper phosphide and copper phosphate. The copper is present in the crystalline zinc oxide film in the form of its sulphide, telluride, selenide, selenate, phosphide or phosphate and in the concentration of 0.01 to 20.0 atomic percent. The piezoelectric crystalline film have high resistivity and a smooth surface so that they can be used in a wide range of low to high frequencies.

11 Claims, 4 Drawing Figures

PIEZOELECTRIC CRYSTALLINE FILM OF ZINC OXIDE

The present invention relates to piezoelectric crystalline films. More particularly, it relates to piezoelectric crystalline films comprising zinc oxide having a hexagonal crystal structure.

There are many methods for making piezoelectric crystalline films of zinc oxide such as, for example, vacuum deposition methods, epitaxial growth methods, and sputtering methods. Among these methods, the sputtering methods, particularly, a radio-frequency sputtering method has been used very often recently because it has the advantage that a high growth rate of the oriented crystalline films is possible, thus making it possible to mass-produce piezoelectric crystalline films industrially.

When making a piezoelectric crystalline film of zinc oxide on a substrate surface with the radio-frequency sputtering method, ceramics of highly pure zinc oxide has been conventionary used as a source of film material. However, even when the radio-frequency sputtering is effected with such a source, it results in the formation of a crystalline film with a rough surface, thus making it impossible to produce a good piezoelectric crystalline film. In addition, it is difficult with such a source to make the c-axis of zinc oxide film perpendicular to the substrate surface. If a piezoelectric crystalline film of zinc oxide has a rough surface, various disadvantages occur. For example, when manufacturing an acoustic surface wave filter with such a zinc oxide film, it is difficult to form interdigital transducers on the film surface, and the produced acoustic surface wave filter tends to have disconnection of interdigital transducers, and causes a large propagation loss in acoustic surface waves. Also, if the c-axis of the zinc oxide film is inclined with respect to the axis perpendicular to the substrate surface, the electromechanical coupling factor is lowered, thus making it difficult to produce a piezoelectric crystalline film transducer with good conversion efficiency.

Recently, piezoelectric crystalline films of zinc oxide containing copper or its oxide have been proposed as crystalline films which overcome the above disadvantages. Such piezoelectric crystalline films can be used effectively at high frequencies, but can not be used at low frequencies since their resistivity is not sufficiently high. Thus, an applicable frequency range of such a piezoelectric crystalline film is narrow.

This is evident from the theory on dielectric relaxation angular frequency ($\omega_c$) which is given by the following equation:

$$\omega_c = \delta/(\epsilon_0 \epsilon_{ZnO}) = 1/(\epsilon_0 \epsilon_{ZnO} \rho_0) \text{ (rad/s)} \quad (1)$$

where
$\delta$ = conductivity of crystalline film $[\Omega^{-1} m^{-1}]$
$\epsilon_0$ = permittivity of vacuum [F/m]
$\epsilon_{ZnO}$ = permittivity of crystalline film
$\rho_0$ = resistivity of crystalline film [$\omega$.m]

In general, it is recognized that the piezoelectric crystalline film possesses piezoelectricity at frequencies where the following relation exists between the dielectric relaxation angular frequency ($\omega_c$) and an angular frequency ($\omega$) at the used frequency: $\omega_c << \omega$. In other words, the piezoelectric crystalline film can be used as a piezoelectric only in a frequency range where the angular frequency ($\omega$) is sufficiently higher than the dielectric relaxation angular frequency ($\omega_c$) (normally, $\omega >> \omega_c \times 100$).

For example, the dielectric relaxation angular frequency for the piezoelectric crystalline film consisting of highly pure zinc oxide (purity: 99.99%) can be found by the equation (1).

$$\omega_c = 1/(\epsilon_0 \epsilon_{ZnO} \rho_0) = 1.33 \times 10^6 \text{ (rad/s)}$$

where
$\epsilon_0 = 8.854 \times 10^{-12}$ (F/m)
$\epsilon_{ZnO} = 8.5$
$\rho_0 = 10^6 (\omega.cm)$ Since the angular frequency ($\omega$) equals $2\pi f$, it is found that the dielectric relaxation frequency $f_c$ is $$f_c = \omega_c/2\pi = (1.33 \times 10^6)/(2 \times 3.14) = 2.12 \times 10^5 \text{ (Hz)}$$

Thus, the piezoelectric crystalline films of highly pure zinc oxide can be used at a frequency higher than 100 MHz. In other words, such piezoelectric crystalline films are applicable only at very high frequencies.

Further, since the piezoelectric crystalline films of zinc oxide containing copper or its oxide possess resistivity of about $10^8$ to $10^9$ $\omega$.cm, $f_c$ is $10^3$ to $10^4$ Hz when calculated by the above equation. Thus, the applicable frequencies of such crystalline films are not less than 100 KHz to 1 MHz.

In this way, although crystalline zinc oxide films of the prior art can be used at frequencies higher than 100 MHz for highly pure zinc oxide or 1 MHz for zinc oxide containing copper or its oxide, they can not be used at low frequencies and the applicable frequency range thereof is narrow.

It is an object of the present invention to provide an improved piezoelectric crystalline film of zinc oxide which overcomes the aforesaid disadvantages and can be used in a wide range of low to high frequencies.

According to the present invention, there is provided a piezoelectric crystalline film on a substrate, the film being a crystalline zinc oxide film with a c-axis perpendicular to the substrate surface, charecterized in that said crystalline film contains one copper compound selected from the group consisting of copper sulphide, copper telluride, copper selenide, copper selenate, copper phosphide and copper phosphate.

The concentrations of the above copper compound in the crystalline zinc oxide film have a large effect on the electrical and physical properties of the film. The concentration of copper, which is present in the form of copper (I) sulphide, copper (II) sulphide, copper (I) telluride, copper (II) telluride, copper (I) selenide, copper selenate, copper (I) phosphide, copper (II) phosphide or copper phosphate, may range from 0.01 to 20.0 atomic percent. If the concentration of copper is less than 0.01 atomic percent, the surface of the resultant crystalline films become rough and the resistivity thereof is lowered. If the concentration of copper is more than 20.0 atomic percent, the direction of the crystallographic orientation of the zinc oxide films can not be well controlled, resulting in the change for the worse in the orientation of the zinc oxide film.

The piezoelectric crystalline film of the present invention possesses the c-axis perpendicular to the substrate surface, thus making it possible to produce piezoelectric transducers with good conversion efficiency.

The piezoelectric crystalline films of the present invention may be made by any conventional methods such as, for example, chemical vapor deposition, vapor deposition, reactive evaporation process, sputtering, radio-frequency sputtering methods, cosputtering methods, ion implanting methods or ion beam deposition methods.

The present invention will be further apparent from the following description with respect to examples and the accompanying drawings, in which.

Figure 1:
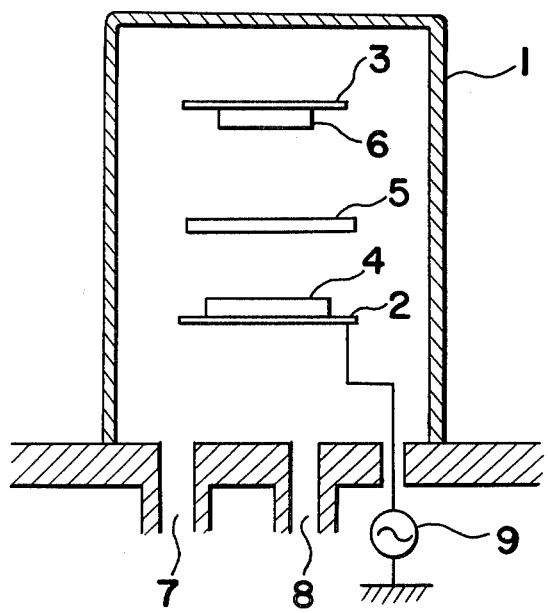
FIG. 1 is a diagrammatic view of the radio-frequency sputtering apparatus used for making piezoelectric crystalline films of the present invention.

Referring now to FIG. 1, there is shown a radio-frequency sputtering apparatus with two electrodes which is used for making piezoelectric crystalline films according to the present invention. The apparatus comprises a bell jar 1 in which a pair of electrodes, i.e., a planar cathode 2 and a planar anode 3 are positioned in parallel. Fixed on the cathode 2 is a source of film material 4 consisting essentially of a ceramic of zinc oxide containing one copper compound selected from the above group. A shutter 5 is positioned between electrodes 2 and 3. A substrate 6, for example, glass, metal, ceramics, single crystal, or resin is fixed to the bottom of the anode 3. The substrate 6 is heated to a temperature of 200° to 500° C. during spittering. A vent 7 and a gas inlet 8 are provided in the bell jar 1.

The radio-frequency sputtering is effected in the following manner: After making it airtight, the bell jar 1 is evacuted through the vent 7 to a pressure not higher than $1\times10^{-6}$ Torr, and then supplied with argon or oxygen gas or a mixture of argon and oxygen through the gas inlet 8, whereby adjusting the pressure to $1\times10^{-1}$ to $1\times10^{-3}$ Torr. A radio-frequency voltage is applied between the bell jar 1 and the cathode 2 by the radio-frequency electric power source 9. Electric power of 2 to 8 W/cm² is applied to the source of film material 4.

The sources of film material consisting essentially of ceramics of zinc oxide containing one copper compound selected from the above group are prepared in the following manner:

Using powder of ZnO, $CuP_3$, $Cu_3(PO_4).3H_2O$, $Cu_2S$, CuS, CuSe, $CuSeO_3.2H_2O$ and CuTe as raw materials, there are prepared mixtures to produce ceramics each having a compositional proportion shown in Table 1. Each of the mixtures are milled by the wet process, dried and then calcined at 600° to 800° C. for 2 hours. The presintered body is crushed, milled by the wet process with an organic binder and then dried. The resultant powder is shaped into discs with a diameter of 100 mm and a thickness of 5 mm at a pressure of 1000 kg/cm² and then fired at 1200° C. for 2 hours to obtain sources of film material.

Included in Table 1 for comparison are sources of film material of the prior art containing copper or copper oxide, which were prepared in the same manner as described above except that discs prepared by using powder of ZnO, Cu and $Cu_2O$ as raw materials were fired at 1300° to 1400° C.

The thus obtained sources of film material were subjected to measurements of resistivity and percentage of bulk density $d_s$ to theoretical density $d_t$ ($d_s/d_t \times 100$). The results are shown in Table 1.

Table 1

| Specimen No. | Additive material | Concentration of Cu (atomic %) | Source of film material Resistivity (Ω · cm) | $(d_s/d_t) \times 100$ (%) | Zinc oxide film Orientation $\overline{X}$ (deg.) | σ | Resistivity (Ω · cm) |
|---|---|---|---|---|---|---|---|
| 1 | $Cu_2S$ | 0.01 | $8.0 \times 10^5$ | 92.0 | 3.1 | 2.5 | $1.1 \times 10^{12}$ |
| 2 | CuS | 0.1 | $2.3 \times 10^6$ | 93.0 | 1.0 | 2.1 | $5.9 \times 10^{13}$ |
| 3 | $Cu_2S$ | 1.0 | $3.9 \times 10^9$ | 95.0 | 1.6 | 1.7 | $8.5 \times 10^{14}$ |
| 4 | $Cu_2S$ | 10.0 | $5.4 \times 10^8$ | 95.0 | 4.2 | 3.4 | $1.2 \times 10^{13}$ |
| 5 | CuTe | 0.01 | $2.5 \times 10^5$ | 92.0 | 3.4 | 4.0 | $1.2 \times 10^{12}$ |
| 6 | " | 0.1 | $1.9 \times 10^7$ | 95.0 | 1.7 | 2.9 | $3.5 \times 10^{13}$ |
| 7 | " | 1.0 | $6.4 \times 10^8$ | 96.0 | 1.9 | 2.2 | $2.7 \times 10^{14}$ |
| 8 | " | 10.0 | $8.2 \times 10^7$ | 94.0 | 5.0 | 4.1 | $4.3 \times 10^{12}$ |
| 9 | CuSe | 0.01 | $1.7 \times 10^4$ | 91.0 | 4.5 | 4.3 | $1.5 \times 10^{12}$ |
| 10 | " | 0.1 | $4.3 \times 10^5$ | 93.0 | 3.4 | 4.0 | $3.1 \times 10^{13}$ |
| 11 | $CuSeO_3 . 2H_2O$ | 1.0 | $2.5 \times 10^8$ | 95.0 | 1.9 | 2.8 | $1.7 \times 10^{14}$ |
| 12 | CuSe | 10.0 | $6.1 \times 10^7$ | 94.0 | 4.8 | 4.1 | $2.8 \times 10^{12}$ |
| 13 | $Cu_3P$ | 0.01 | $4.7 \times 10^5$ | 95.6 | 2.2 | 2.7 | $4.7 \times 10^{12}$ |
| 14 | " | 0.1 | $3.0 \times 10^6$ | 97.5 | 2.4 | 2.8 | $1.3 \times 10^{13}$ |
| 15 | $Cu_3(PO_4) . 3H_2O$ | 1.0 | $8.9 \times 10^9$ | 99.2 | 1.1 | 2.2 | $2.9 \times 10^{14}$ |
| 16 | $Cu_3P$ | 10.0 | $1.5 \times 10^9$ | 98.1 | 5.2 | 4.8 | $3.2 \times 10^{12}$ |
| 17 | Cu | 0.1 | $2.3 \times 10^4$ | 86.0 | 2.3 | 3.7 | $8.7 \times 10^6$ |
| 18 | " | 1.0 | $7.5 \times 10^6$ | 87.0 | 2.9 | 3.3 | $9.1 \times 10^8$ |
| 19 | $Cu_2O$ | 10.0 | $5.0 \times 10^7$ | 89.0 | 14.8 | 7.8 | $7.0 \times 10^7$ |

Using the respective sources of film material obtained, piezoelectric crystalline films of zinc oxide are made on glass substrates with the aforesaid radio-frequency sputtering apparatus. The radio-frequency sputtering is carried out under the following conditions: A mixed gas of 90 vol % of argon and 10 vol % oxygen is supplied to the bell jar 1 through the gas inlet 8, whereby adjusting the pressure in the bell jar 1 to $2\times10^{-3}$ Torr. The glass substrate is heated to and kept at 350° C. The source 4 is supplied 6 W/cm² of an electric power with a frequency of 13.56 MHz.

The c-axis orientation of the thus obtained piezoelectric crystalline films was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation. vol. 2 (1973) page 84; and Makoto Minakata, The Tohoku University Doctor's Thesis (1974)). The mean value ($\overline{X}$)

and standard deviation (δ) of the angle of c-axis with respect to the axis perpendicular to the substrate surface were obtained from respective specimens. The results are shown in Table 1. The resistivity of the crystalline films are also shown in Table 1.

As can be seen from Table 1, the piezoelectric crystalline films according to the present invention have a c-axis approximately perpendicular to the substrate surface, from which it will be understood that the piezoelectric crystalline films of the present invention possess a large electromechanical coupling factor, i.e., good conversion efficiency. Further, the piezoelectric crystalline films of the present invention have extremely high resistivity so that they can be used even at low frequencies.

An applicable frequency range of the zinc oxide piezoelectric crystalline films of the present invention can be obtained by the determination of $\omega_c$ with the aforesaid equation. The values obtained of $\omega_c$ for specimen Nos. 1 through 16 range from $10^2$ to 1. Thus, the lowermost applicable frequency of the piezoelectric crystalline films of the present invention is not less than 1 Hz. This means that the piezoelectric crystalline films of the present invention can be used in a wide range of low to high frequencies. Thus, the piezoelectric crystalline films of the present invention can be applied to low frequency transducers such as, for example, a miniaturized tuning fork, opt electronic devices such as, for example, a wave guide.

Figure 2:
FIG. 2 is an electron micrograph of a conventional crystalline piezoelectric film.

Specimen Nos. 3 and 18 were photographed through a scanning electron microscope at a magnification of 1000. FIG. 2 is an electron micrograph of specimen No. 18, and FIG. 3, that of specimen No. 3.

Figure 3:
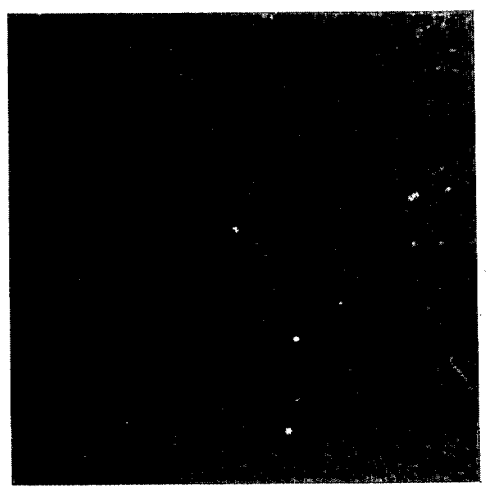
FIG. 3 is an electron micrograph of a piezoelectric crystalline films of the present invention.

As can be seen from these figures, the piezoelectric crystalline film of the prior art has a rough surface (cf. FIG. 2), while the piezoelectric crystalline film of the present invention has a smooth surface (cf. FIG. 3).

Figure 4:
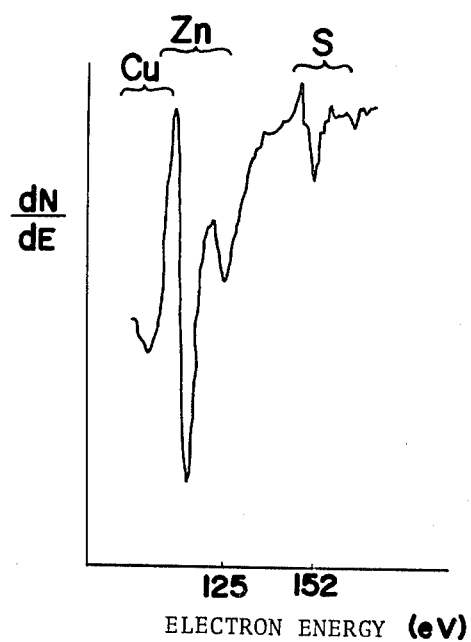
FIG. 4 is Auger spectroscopic patterns of the piezoelectric crystalline film of the present invention.

In order to confirm the presence of copper compound, the piezoelectric crystalline film of specimen No. 3 was subjected to Auger spectroscopy. FIG. 4 shows Auger spectroscopic patterns of specimen No. 3, from which it can be seen that copper sulphide is present in the piezoelectric crystalline film. The presence of other copper compounds in the respective piezoelectric crystalline films was confirmed by spectroscopie analysis and ESCA.

From the above results, it is believed that the considerable increase of the resistivity of the piezoelectric crystalline films of the present invention results from the incorporation of one copper compound selected from the above group into the film.

The use of a source of film material containing copper compound selected from the group mentioned above has its own advantages, as follows.

When mass-producing piezoelectric crystalline films industrially by radio-frequency sputtering methods, it is necessary to increase the growth rate of crystalline films as much as possible. To do this, the electric power supplied to the source of film material per unit area thereof is increased with the result that the source of film material is required to have a high bulk density. This requirement is fully met by the sources containing a copper compound selected from the above group. As is evident from Table 1, these sources of film material have a bulk density higher than the conventionally used sources. Thus, the sources of film material containing the above copper compound make it possible to mass-produce zinc oxide piezoelectric crystalline films by the use of high electric power.

In addition, although the firing temperature for preparing comventionally used sources containing copper or copper oxide range from 1300° to 1400° C., the incorporation of one copper compound selected from the above group makes possible a lower firing temperature for the sources, thus making it easier to prepare them and lowering their cost.

What is claimed is:

1. A piezoelectric crystalline film having a wide applicable range from low to high frequencies on a substrate, said film consisting essentially of a crystalline zinc oxide film with a hexagonal crystal structure and a c-axis substantially perpendicular to the substrate surface, said crystalline zinc oxide film containing one copper compound selected from the group consisting of copper sulphide, copper telluride, copper selenide, copper selenate, copper phosphide and copper phosphate the concentration of copper being 0.01 to 20.0 atomic percent.

2. A piezoelectric crystalline film according to claim 1 wherein said copper compound is copper (I) sulphide.

3. A piezoelectric crystalline film according to claim 1 wherein said copper compound is copper (II) sulphide.

4. A piezoelectric crystalline film according to claim 1 wherein said copper compound is copper (I) telluride.

5. A piezoelectric crystalline film according to claim 1 wherein said copper compound is copper (II) telluride.

6. A piezoelectric crystalline film according to claim 1 wherein said copper compound is copper (I) selenide.

7. A piezoelectric crystalline film according to claim 1 wherein said copper compound is copper selenate.

8. A piezoelectric crystalline film according to claim 1 wherein said copper compound is copper (I) phosphide.

9. A piezoelectric crystalline film according to claim 1 wherein said copper compound is copper (II) phosphide.

10. A piezoelectric crystalline film according to claim 1 wherein said copper compound is copper phosphate.

11. A piezoelectric crystalline film according to claim 1 wherein the substrate is selected from the group consisting of metal, glass, ceramics, single crystals and resin.

* * * * *